United States Patent [19]

Miles

[11] Patent Number: 4,523,161
[45] Date of Patent: Jun. 11, 1985

[54] PROGRAMMABLE ATTENUATOR

[75] Inventor: Frank Miles, Ann Arbor, Mich.

[73] Assignee: Tektronix, Inc., Beaverton, Oreg.

[21] Appl. No.: 534,897

[22] Filed: Sep. 22, 1983

[30] Foreign Application Priority Data

Oct. 27, 1982 [JP] Japan ............... 57-188904

[51] Int. Cl.³ .............................................. H03H 7/24
[52] U.S. Cl. .................................. 333/81 R; 307/568;
323/350; 323/351
[58] Field of Search ............ 333/81 R; 307/540, 555,
307/567, 568; 323/349–351; 330/284

[56] References Cited

U.S. PATENT DOCUMENTS 3,193,759 7/1965 Bogdan, Jr. et al. ......... 333/81 R X
4,121,183 10/1978 Murphy ........................... 333/81 R Primary Examiner—Paul Gensler
Attorney, Agent, or Firm—George T. Noe

[57] ABSTRACT

A programmable attenuator includes MOS FET switches to electronically select a plurality of attenuation factors in a 1-2-5 step sequence. Such an attenuator is particularly suited for use in the input circuit of an oscilloscope.

1 Claim, 4 Drawing Figures

PROGRAMMABLE ATTENUATOR

BACKGROUND OF THE INVENTION

The present invention relates generally to programmable attenuators, and more particularly to an electrically controllable attenuator particularly suited for high frequency applications.

Since digital controllers such as mini-computers and microprocessors are readily available in the market place, it is becoming more and more desirable to automate electrical functions in automatic test and measurement instruments, such as oscilloscopes, wherein many controls are often required to provide a selection of parameters for a desired test set up. One such test set up is the selection of attenuation of an input signal.

One prior art programmable attenuator is that taught by Murphy in U.S. Pat. No. 4,121,183, assigned to the assignee of the present invention. This is an RC attenuator employing field-effect transistor (FET) switching. There are several disadvantages associated with this type of programmable attenuator. Finite resistance of the switching FET when turned on causes attenuation error and thermal instability. A switchable amplifier is required therein in order to obtain more than two sub-decimal attenuation factors; however, this switchable gain amplifier results in a difficulty in maintaining a constant frequency response.

It is therefore an object of the present invention to provide an improved programmable attenuator overcoming the foregoing disadvantages of the prior art attenuator.

It is another object of the present invention to provide a switchable attenuator suitable for high-frequency applications.

It is yet another object of this invention to provide a programmable attenuator particularly suited for the vertical input circuit of an oscilloscope.

Other objects, features, and advantages of the present invention will become apparent to those having skill in the art upon a reading of the following description when taken in conjunction with the accompanying drawings.

DRAWINGS

DETAILED DESCRIPTION OF THE INVENTION

Figure 1:
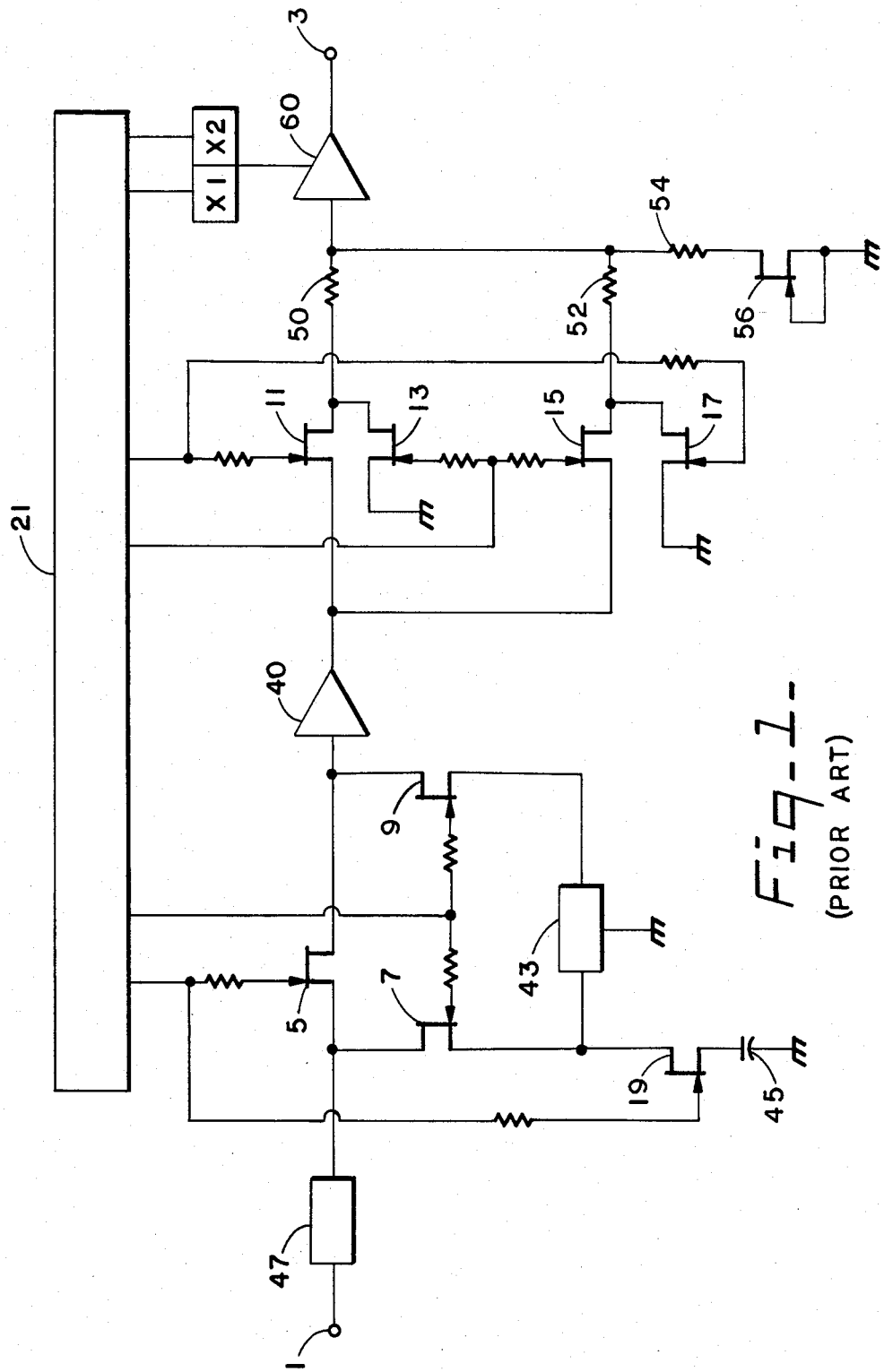
FIG. 1 is a schematic of a programmable attenuator in accordance with the prior art.

Referring now to FIG. 1, there is shown the prior art programmable attenuator as taught by Murphy in U.S. Pat. No. 4,121,183 as mentioned earlier. This prior art attenuator comprises decimal (divide by ten) RC attenuator assembly 43, impedance converter 40, sub-decimal (divide by two and divide by five) RC attenuator including resistors 50, 52, and 54, and a switchable-gain amplifier 60 connected in cascade between an input terminal 1 and an output 3. A control circuit 21 is utilized to control the on-off status of FETs 5, 7, 9, and 19 to selectively insert decimal attenuator 43 into the circuit, and FETs 11, 13, 15, and 17 to select the sub-decimal attenuators and a gain of output amplifier 60. Either FET pair 5-19 or 7-9 is selectively rendered conducting by the switch control circuit 21, effectively removing or inserting attenuator 43 into the signal path depending upon the pair of conducting FETs. Similarly, either FET pair 11-17 or 13-15 is selectively turned on to select the divide-by-2 and divide-by-5 attenuation factors respectively. The divide-by-2 attenuator is formed by resistor 50 in series with the signal path and the parallell combination of resistor 52 and 54 as a shunt element. The divide-by-5 attenuator is formed by resistor 52 as the series element while the parallel combination of resistors 50 and 54 provide the shunt element. It should be noted that the FETs, which are junction field-effect transistors, have a finite resistance when conducting which may vary according to temperature. In order to reduce temperature sensitivity, an additional FET 56 is operated in series with shunt resistor 54. This attenuator permits selecting attenuation factos in a so-called 1-2-5 step sequence, and employs both the switchable FETs and the switchable-gain amplifier 60.

Figure 2:
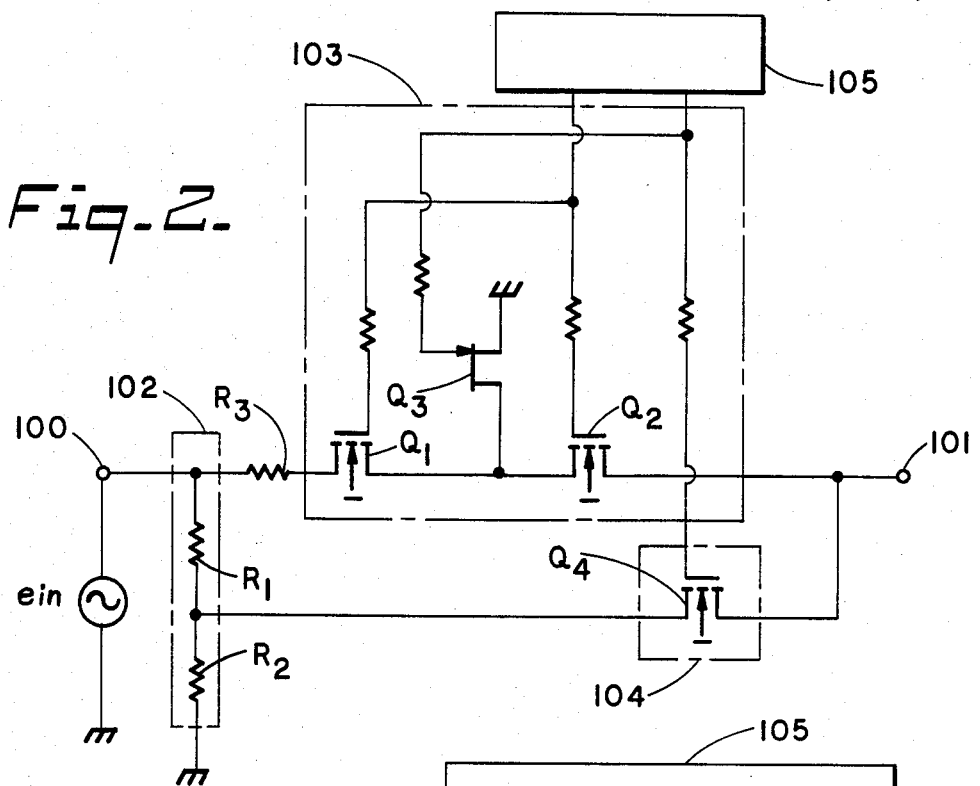
FIG. 2 is a simplified schematic of a programmable attenuator in accordance with the present invention.

FIG. 2 shows a principle circuit of the programmable attenuator according to this invention. Two different attenuation factors may be chosen depending on a control signal. Applied to input terminal 100 is an input signal voltage source $e_{in}$ of fairly low internal resistance. In practice input signal source $e_{in}$ may represent an output of an impedance converter amplifier including an emitter follower output stage. Resistive divider 102 including series resistors $R_1$ and $R_2$ is connected between input terminal 100 and ground. First electronic switch 103 is connected between input terminal 100 and output terminal 101 by way of resistor $R_3$. Also, second electronic switch 104 is connected between the output of resistive divider 102 (junction of $R_1$ and $R_2$) and output terminal 101. Switch control circuit 105 is employed to control electronic switches 103 and 104.

First electronic switch 103 comprises a pair of series DMOS (double diffused metal oxide semiconductor) FETs $Q_1$ and $Q_2$ and a junction FET connected between the junction of $Q_1$–$Q_2$ and ground. Second electronic switch 104 comprises a single DMOS FET $Q_4$. DMOS FETs feature high frequency operation and sufficiently low "on" resistance because of short channel length. The gates of the FETs $Q_1$ and through $Q_4$ are connected to receive control signals from switch control circuit 105.

In operation, the proper gate voltage is applied to turn $Q_1$ and $Q_2$ on and $Q_3$ and $Q_4$ off. The input and output terminals 100–101 are coupled together to transmit the input signal with minimum or essentially no signal attenuation. It should be noted that a finite capacitance is present between the source and drain electrodes of non-conducting DMOS FET $Q_4$. This stray capacitance may couple the input signal to output terminal 101. However, such leakage or blow-by signal is negligible in practice because the input signal to $Q_4$ is already attenuated by resistive divider 102 by a predetermined amount, e.g. 1/5 depending on a particular application. In addition, since the resistance of $R_1$, $R_2$ and $R_3$ may be very low i.e., in the order of 100 ohms or less, the source-to-drain capacitance of $Q_3$ is also negligible for the signal passing through $Q_1$–$Q_2$.

On the other hand, for attenuating the input signal, $Q_3$ and $Q_4$ are turned on while turning $Q_1$ and $Q_2$ off. Second electronic switch $Q_4$ now transmits the attenuated input signal to output terminal 101. Even a small amount of blow-by signal of the non-attenuated input signal through $Q_1$ and $Q_2$ may be a relatively large percentage of the attenuated signal through $Q_4$, thereby the blow-by is not negligible in this position. However, $Q_3$ effectively removes the blow-by by-passing it to ground. Additionally, the series connection of two FETs $Q_1$-$Q_2$ also reduces the effect because the source-to-drain capacitance is reduced to one half.

Series resistor $R_3$ is inserted to equalize the output impedance of the programmable attenuator at both attenuator settings. This is, of course, very important in order to determine the input impedance for a wideband attenuator to be connected at the subsequent stage of the attenuator. $R_3$ also has another important role in reducing the capacitive loading to the input signal when $Q_3$ is conducting. That is, the input signal would be bypassed directly through the drain-to-source capacitance of $Q_1$ without resistor $R_3$.

Figure 3:
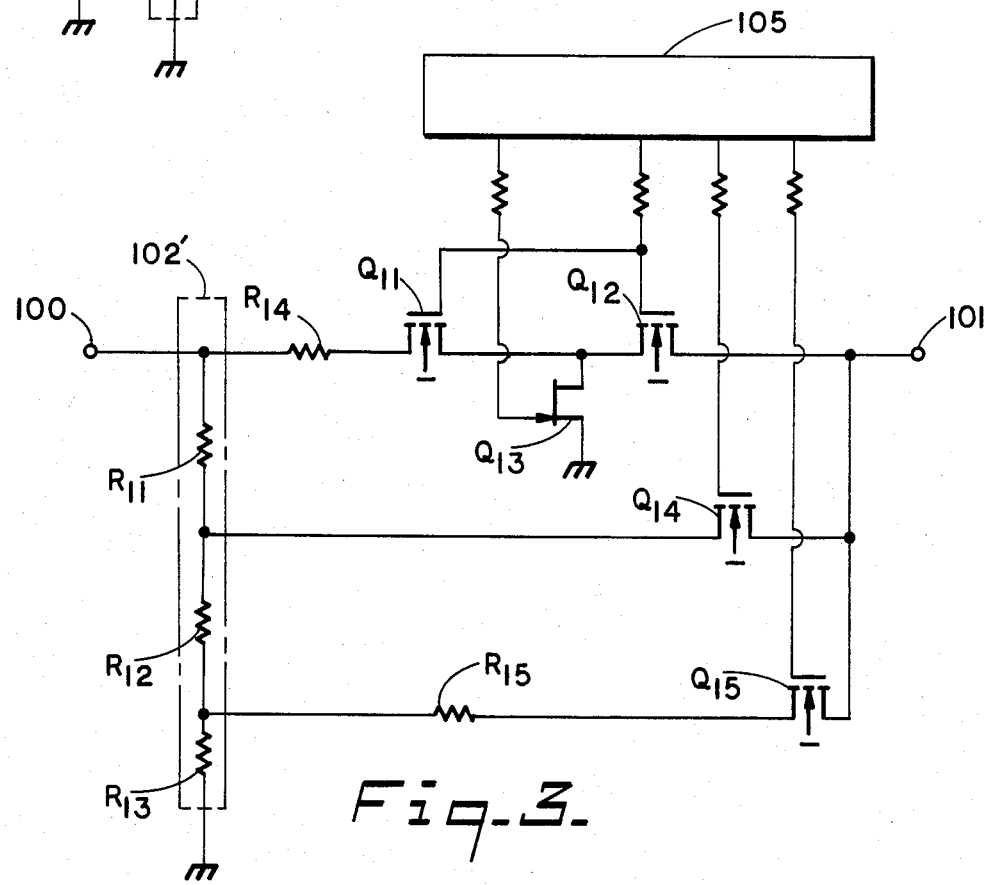
FIG. 3 is an alternative embodiment of the present invention.

Although the attenuator in FIG. 2 selects only non-attenuated and attenuated settings, the present invention may be easily applied to three or more different attenuation settings. FIG. 3 shows a simplified schematic of an alternative programmable attenuator according to this invention capable of selecting three different attenuation factors. The circuit arrangement and operation are similar to those of FIG. 2 except that resistive divider 102' now includes three series resistors $R_{11}$, $R_{12}$ and $R_{13}$ and a third electronic switch DMOS FET $Q_{15}$. The signal is not attenuated when $Q_{11}$ and $Q_{12}$ are on but attenuated respectively to, for example, ½ and 1/5 when $Q_{14}$ and $Q_{15}$ and conducting. In addition, no resistor is connected in series with $Q_{14}$. That is, resistors $R_{11}$, $R_{12}$ and $R_{13}$ are chosen to be such a value as to provide the predetermined output resistance while maintaining the proper attenuation ratio when $Q_{14}$ is conducting. However, resistors $R_{14}$ and $R_{15}$ are connected in series with the respective electronic switch to maintain a constant output impedance.

Again, it should be noted that the first electronic switch at the no-attenuation stage includes a pair of series DMOS FETs $Q_{11}$ and $Q_{12}$ and also additional shunt FET $Q_{12}$ for blow-by blocking purpose.

Figure 4:
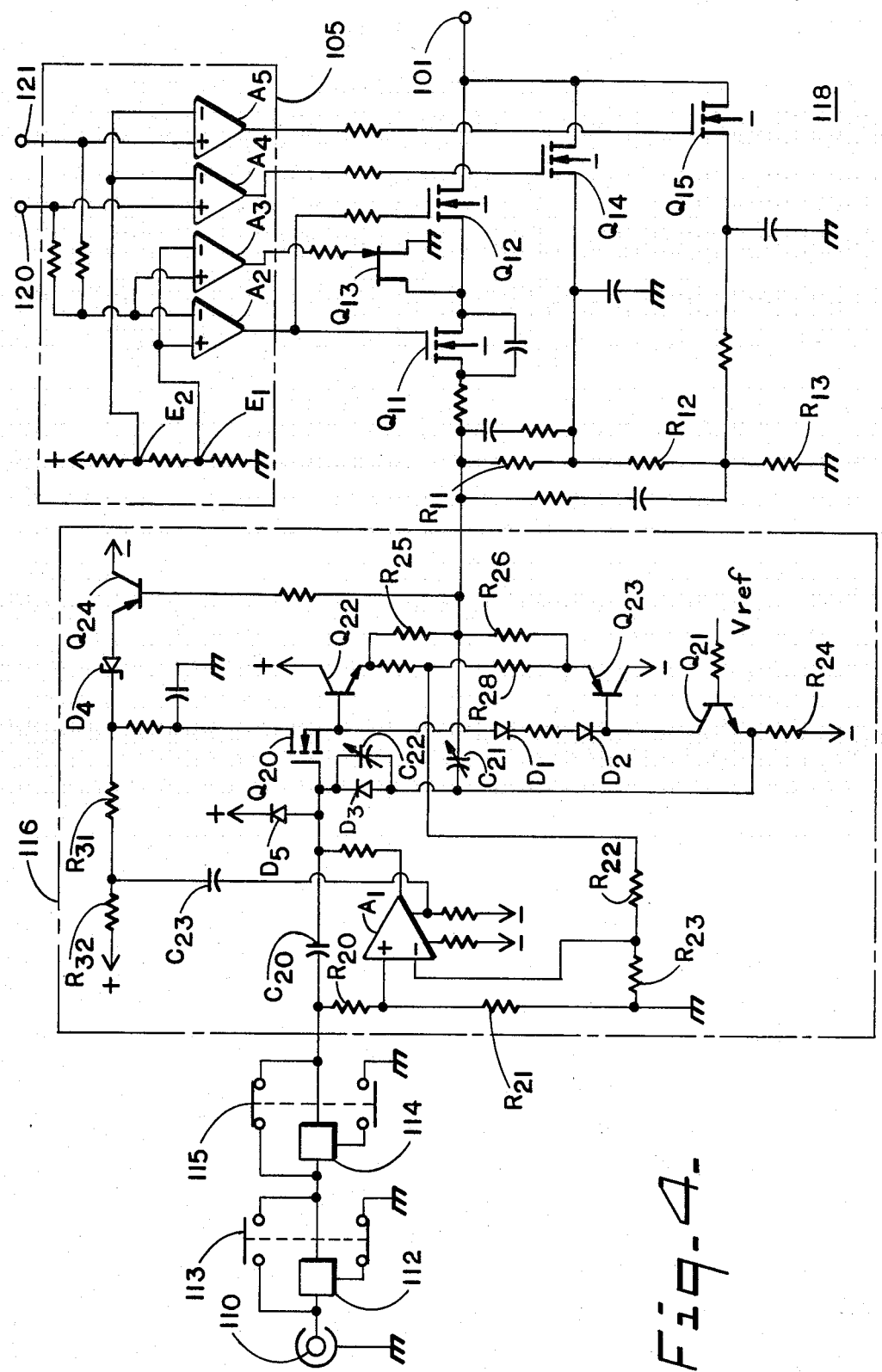
FIG. 4 is a schematic of a commercial embodiment of the present invention.

FIG. 4 shows a circuit schematic of the programmable attenuator suited for an oscilloscope or similar applications in which the present invention is incorporated.

An input signal applied to input connector 110 is selectively attenuated by two cascade connected decimal attenuators 112 and 114 which are respectively controlled by switches 113 and 115. These switches may be driven by electrical relays as is well known in the art. The output from decimal or decade attenuator stage is applied to impedance converter 116.

Impedance converter 116 includes AC coupling capacitor $C_{20}$, resistive divider $R_{20}$-$R_{21}$ to determine the input impedance, operational amplifier $A_1$ as a low frequency amplifier, source follower DMOS FET $Q_{20}$ and current source transistor $Q_{21}$, output stage emitter follower amplifier transistors $Q_{22}$-$Q_{23}$, and bootstrap transistor $Q_{24}$. The output of $Q_{22}$-$Q_{23}$ is fed back to the inverting input of operational amplifier $A_1$ by way of resistive divider $R_{22}$-$R_{23}$ having a similar dividing ratio to divider $R_{20}$-$R_{21}$. The output of $A_1$ is fed through large resistor $R_{30}$ to the gate of FET $Q_{20}$. Diodes $D_3$ and $D_5$ provide overload protection of $Q_{20}$. Capacitor 22 adjusts the input capacitance while $C_{21}$ provides high frequency again adjustment. $C_{23}$ is used to reduce substrate capacitive loading in operational amplifier $A_1$. Transistor $Q_{24}$ and Zener diode $D_4$ ensure $Q_{20}$ amplifies the input signal with minimum signal distortion. Impedance converter 116, is of course, a high input and low output impedance, unity gain amplifier.

Sub-decimal attenuator section 118 is essentially the same as FIG. 3 and selects three different attenuation factors, e.g. 1/1, 1/2 and 1/5. The only significant difference is the inclusion of capacitors across dividing resistors $R_{11}$, $R_{12}$ and $R_{13}$ so that the attenuator operates over a wide range of frequencies and the input capacitance remains unchanged at different attenuation factors.

Switch control ciruit 105 comprises four comparators $A_2$ through $A_2$ and reference voltage source $E_1$ and $E_2$. Either one of a pair of control terminals 120–121 is logically high, and either $Q_{14}$ or $Q_{15}$, depending upon to whichever a voltage is applied, turns on to provide the attenuated outut (1/2 or 1/5). Simultaneously, comparator $A_3$ provides a high output level to turn $Q_{13}$ on, thereby blocking the aforementioned blow-by signal. However, if both control terminals 120 and 121 are logically low, comparators $A_2$ and $A_3$ provide respectively a high and low output to turn $Q_{11}$ and $Q_{12}$ on and $Q_{13}$ off to select the non-attenuated output. The control signal to control terminals 120 and 121 is supplied from a microprocessor or a similar central control device by way of a data latch.

The programmable attenuator in FIG. 4 now provides the attenuation factors of 1/1, 1/2, 1/5, 1/10, 1/20, 1/50, 1/100, 1/200, and 1/500 to switch the voltage sensitivity in the 1–2–5 steps. The advantages of this programmable attenuator system between input terminal 110 and output terminal 101 are as follows: The attenuation factor may be switched over a wide range in 1–2–5 steps without switching the gain of an output amplifier. Attenuation factors may be switched by electrical control signals to decimal and sub-decimal attenuator stages, thereby being programmable and remote controllable. The use of DMOS FET switches for lower resistance sub-decimal attenuator ensures more accurate attenuation and less sensitivity to temperature variations. The use of a pair of series DMOS FETs and a shunt FET as the electronic switch for the non-attenuation setting effectively eliminates the blow-by problem associated with stray capacitance. The impedance converter including both high and low frequency amplifier sections provides very stable low frequency or DC characteristic.

The present invention has been described on the principle and practical application thereof. It should be noted, however, that the present invention can be modified without departing from the broad aspect of this invention best suited for particular applications. The present invention may be applied to obtain more than three attenuation factors. The present invention should be interpreted to cover such modifications.

What I claim as my invention is:

1. A programmable attenuator, comprising:
   first and second resistors connected in series between an input terminal and ground;
   first electronic switch means connected between the input terminal and an output terminal;
   second electronic switch means connected between the junction of said first and second resistors and the output terminal; and
   control means for operating said first and second electronic switch means, wherein said second electronic switch means includes a single transistor while said first electronic switch means includes a pair of series-connected transistors and an additional shunt transistor connected between the junction of said series transistors and ground.

* * * * *

UNITED STATES PATENT AND TRADEMARK OFFICE
CERTIFICATE OF CORRECTION

PATENT NO. : 4,523,161

DATED : June 11, 1985

INVENTOR(S) : Frank Miles

It is certified that error appears in the above—identified patent and that said Letters Patent is hereby corrected as shown below:

Col. 2, line 19, "factos" should read --factors--.

Col. 3, line 31, "and" should read --are--.

Col. 3, line 41, "$Q_{12}$" should read --$Q_{13}$--.

Col. 3, line 65, "again" should read --gain--.

Col. 4, line 11, "$A_2$" (2nd occurence) should read --$A_5$--.

Col. 4, line 15, "outut" should read --output--.

Signed and Sealed this

Twenty-ninth Day of October 1985

[SEAL]

Attest:

Attesting Officer

DONALD J. QUIGG

Commissioner of Patents and Trademarks—Designate